US009830291B2

United States Patent
Seifried et al.

(10) Patent No.: US 9,830,291 B2
(45) Date of Patent: Nov. 28, 2017

(54) CONNECTING DEVICE, METHOD FOR THE OPERATION THEREOF, AND BUS COMMUNICATION DEVICE

(71) Applicant: R. STAHL Schaltgeräte GmbH, Waldenburg (DE)

(72) Inventors: Michael Seifried, Schwäbisch Hall (DE); Jörg Stritzelberger, Öhringen (DE)

(73) Assignee: R. STAHL SCHALTGERÄTE GMBH, Waldenburg (DE)

( * ) Notice: Subject to any disclaimer, the term of this patent is extended or adjusted under 35 U.S.C. 154(b) by 382 days.

(21) Appl. No.: 14/560,046

(22) Filed: Dec. 4, 2014

(65) Prior Publication Data
US 2015/0155667 A1  Jun. 4, 2015

(30) Foreign Application Priority Data
Dec. 4, 2013  (DE) .................. 10 2013 113 474

(51) Int. Cl.
G06F 13/40 (2006.01)
G05B 19/00 (2006.01)
G01R 31/28 (2006.01)

(52) U.S. Cl.
CPC .......... G06F 13/40 (2013.01); G05B 19/00 (2013.01); G01R 31/2829 (2013.01); Y10T 307/492 (2015.04)

(58) Field of Classification Search
CPC ....... H04L 43/045; H04L 47/11; H04L 47/24; H04W 24/08
See application file for complete search history.

(56) References Cited

U.S. PATENT DOCUMENTS 6,618,745 B2 *  9/2003  Christensen ......... G05B 19/042
                                                   702/182
7,519,083 B2 *  4/2009  Stevenson .......... G05B 19/4185
                                                   370/469

(Continued)

FOREIGN PATENT DOCUMENTS

EP       1819028 A2 *  8/2007 ............... H02J 1/10

OTHER PUBLICATIONS

Office Action in corresponding German application No. 102013113474.2, dated Jul. 15, 2014, 6 pages.

*Primary Examiner* — Freshteh N Aghdam
(74) *Attorney, Agent, or Firm* — Fitch, Even, Tabin & Flannery LLP

(57) ABSTRACT

A connecting device (27) has a first connection input (28), a second connection input (29), and a connection output (30). The two connection inputs (28, 29) are configured for connection to a bus coupling device (20, 21). The connection output is configured for connection to a subscriber (13). The first connection input (28) is connected without switches to the connection output (30) via a first connecting branch (31). The second connection input (29) is connected without switches to the connection output (30) via a second connecting branch (32). The connecting device (27) includes a diagnostic unit (39), which generates a diagnostic signal (D) depending on the first input voltage (U1) and/or the first input current (I1) at the first connection input (28) and/or on the second input voltage (U2) and/or the second input current (I2) at the second connection input (29).

19 Claims, 4 Drawing Sheets

(56) References Cited

U.S. PATENT DOCUMENTS

2007/0240080 A1* 10/2007 Eldridge .................. G06F 8/34
                                                      715/835
2011/0279939 A1    11/2011 Kitchener et al.

* cited by examiner

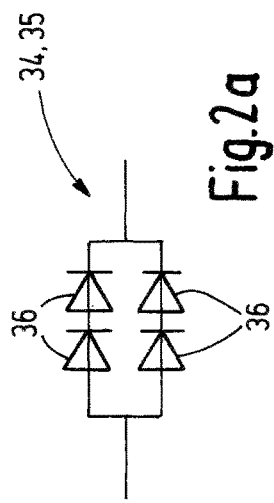
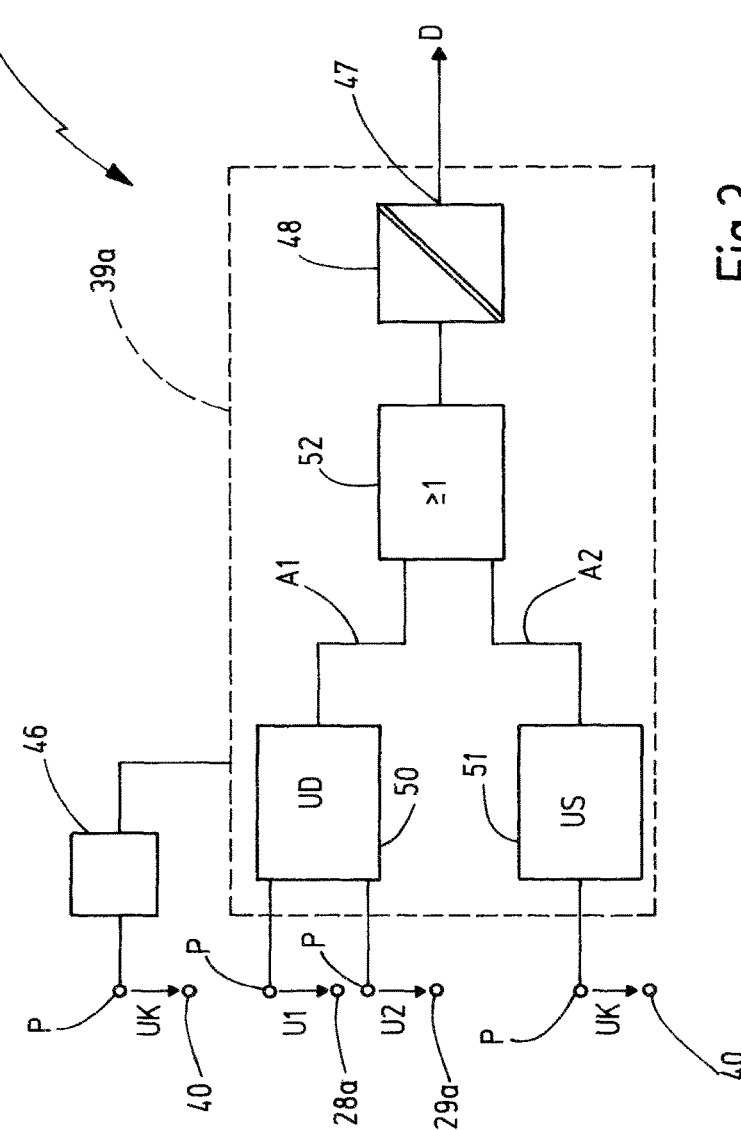

CONNECTING DEVICE, METHOD FOR THE OPERATION THEREOF, AND BUS COMMUNICATION DEVICE

RELATED APPLICATION(S)

This application claims the benefit of German Patent Application No. 10 2013 113 474.2 filed Dec. 4, 2013, the contents of which are incorporated herein by reference as if fully rewritten herein.

TECHNICAL FIELD

The invention relates to a connecting device, to a method for the operation thereof, and to a bus communication device having a bus line. The bus line is preferably two-wire. This may involve a fieldbus, for example.

BACKGROUND

Preferably multiple bus coupling devices are connected to the bus line, which are used to connect subscribers to the bus line. Each subscriber can be addressed via the bus line. The subscribers can include sensors and/or actuators. As a result of the bus communication device, it is possible for a host computer to communicate with the subscribers, for example to receive data from the subscribers or transmit data to the subscribers. Bus communication devices, such as a Foundation Fieldbus H1 system or a Profibus PA system, are known.

EP 1 819 028 A2 describes a redundant fieldbus system. Two fieldbus lines are provided in each case with a power supply unit there and are connected to a host. A bus coupling device is used to couple the subscribers to the bus lines. The bus coupling device is connected to the two bus lines, and thus also to the two power supply units. Subscribers can be redundantly connected to the bus coupling device so that each subscriber is connected to the two bus lines. In this way redundancy is achieved, so that communication via the respective other bus line is possible even when one bus line or one power supply unit fails. Simultaneous operation of the two bus lines is not possible because otherwise the wave impedance is cut in half by the parallel connections of two bus lines and no longer meets the requirements of the fieldbus protocol.

SUMMARY

Proceeding from the known bus communication devices, it is an object of the present invention to improve the operating reliability of a bus communication device using simple means.

This object is achieved by the bus communication device having the features of claim 1, by a method having the features of claim 17, and by a connecting device having the features of claim 20. The bus communication device comprises a preferably two-wire bus line, to which a first bus coupling device and a second bus coupling device are electrically connected respectively. Each bus coupling device has at least one, and preferably multiple coupling outputs. Each coupling output can be connected to a subscriber so as to couple the same to the bus line.

A connecting device is interconnected between a subscriber and the two bus coupling devices, or the connecting device is configured to be interconnected between the subscriber and the two bus coupling devices. The connecting device has a first connection input, a second connection input, and a connection output. The first connection input is electrically connected to the connection output via a first connecting branch, and the second connection input is electrically connected to the connection output via a second connecting branch. A respective decoupling circuit is disposed in each connecting branch, so that current is suppressed from flowing from one connection input to the respective other connection input. The subscriber is electrically connected to the connection output. The connecting branches are designed without switches or interrupters, so that a permanent electrical connection exists between the particular connection input and the connection output. It is also possible for more than two connection inputs to be present.

A coupling output of the first bus coupling device is electrically connected to the first connection input, while a coupling output of the second bus coupling device is electrically connected to the second connection input. In particular, a permanent electrical connection exists between the connection output and the one coupling output of the first bus coupling device and the other coupling output of the second bus coupling device.

The electric power required at the connection output of the subscriber is thus preferably evenly distributed among the two bus coupling devices. The load on the bus coupling devices is reduced, and at the same time a redundant connection is established between the subscriber and the bus line. A simple fault in one of the two bus coupling devices does not cause a loss of communication with the connected subscriber. The communication path between one bus coupling device and the subscriber via the connecting device is preferably designed without switches and thus exists at all times, regardless of the operating state. It is not provided to establish or switch the communication connection between the subscriber and a respective one of the two bus coupling devices connected thereto. Only one bus line is connected to each bus coupling device. The connecting device provides redundancy when one of the two bus coupling devices fails entirely or partially. The electric power for the subscriber is provided to the subscriber via both bus coupling devices and both connecting branches during fault-free normal operation. It is only when one of the two bus coupling devices fails entirely or partially that more or all of the electric power is provided to the subscriber via the respective other bus coupling device and the appropriate connecting branch.

The connecting device preferably comprises a diagnostic unit. The diagnostic unit is electrically connected to the two connection inputs and generates a diagnostic signal. The diagnostic signal is dependent on the input voltages at the two connection inputs and/or on the input currents at the two connection inputs. In particular, a difference between the two input voltages and/or between the two input currents is ascertained. As an alternative or in addition, the levels of the input voltages and/or of the input currents are evaluated and taken into consideration in the generation of the diagnostic signal.

The failure of one of the two bus coupling devices can be detected via the diagnostic unit and output by the diagnostic signal. The function of the bus communication device is maintained when a fault occurs. A simple fault can be indicated via the diagnostic unit and repaired without interrupting communication.

The bus coupling devices and/or the connecting device and/or the subscribers preferably have explosion-protected designs. For example, the aforementioned devices exclusively can comprise intrinsically safe circuits.

The bus coupling devices can include a DC-DC converter in each case in one exemplary embodiment. In this way, galvanic isolation is achieved between the subscribers and the bus line.

The diagnostic signal of the diagnostic device can be transmitted to an optical and/or acoustic display device. As an alternative or in addition it is also possible to transmit the diagnostic signal to a subscriber which is in communication connection with the bus line and which can change the operating state thereof as a function of the diagnostic signal. In this way, a fault indicated by the diagnostic signal can be communicated via the bus line, for example to a host computer of the bus communication device.

In the preferred exemplary embodiment, the diagnostic unit and/or the display device are supplied with electric power preferably exclusively via one or both bus coupling devices. Additional power sources are preferably not present.

A current limiting means, for example a resistor arrangement, can be disposed in the first connecting branch and/or the second connecting branch. In particular in the explosion-protected design, it must be ensured that the electric power does not exceed permissible values even during operation via two properly operating bus coupling devices.

In one embodiment, the decoupling circuit can be formed by a diode circuit, which comprises at least one diode. The diode circuit can be exclusively composed of at least one diode. A transistor circuit can be used as an alternative to the diode circuit, wherein the electrical connection of the transistor is established only when current flows in one direction, so that the current flow in the respective other direction is blocked.

The diode circuit can also comprise multiple diodes, preferably a series connection and/or a parallel connection of at least two diodes respectively. In a preferred exemplary embodiment, the diode circuit includes at least four diodes, wherein two series connections, connected in parallel, having at least two diodes in each case are provided. It is thus prevented even in the event of a short circuit of one diode that current can flow from one connection input to the other connection input. The interruption of the connection in the event of a failure of one diode does not cause a loss of the electrical connection between the particular connection input and the connection output due to the parallel connection.

It is advantageous if a branch resistor is connected in series with the decoupling circuit in each connecting branch. In this way, load differences due to different electrical powers of the two bus coupling devices can be reduced or compensated for. The branch resistors are preferably selected in such a way that the input currents at each connection input differ by no more than 10%, or by no more than 5%.

The diagnostic signal of the diagnostic device can take on a first signal state and a second signal state in one exemplary embodiment. The first signal state characterizes the normal operating state of the two coupling devices when both coupling devices operate without fault and provide sufficient voltage and/or electric power even under load. In the second signal state, the diagnostic signal characterizes an error state of at least one of the two bus coupling devices.

Advantageously, the difference between the two input voltages and/or between the two input currents at the two connection inputs exceeding a predefined first difference value is a condition sufficient for switching the diagnostic signal from the first signal state to the second signal state. In this case, the diagnostic device recognizes that one bus coupling device is not able to provide sufficient input voltage or sufficient input current and displays this fault via the diagnostic signal.

The difference between the two input voltages and/or between the two input currents at the two connection inputs dropping below a second difference value is preferably a condition necessary for switching the diagnostic signal from the second signal state to the first signal state. The first and the second difference values preferably differ so that hysteresis is achieved when switching between the two signal states.

It is moreover advantageous when a condition sufficient for switching the diagnostic signal from the first signal state to the second signal state is met by the level of at least one of the two input voltages and/or of at least one of the two input currents at the two connection inputs dropping below a first threshold value. When the level of one input voltage or of one input current becomes too small, a fault of the particular bus coupling device can be inferred. This measure also allows faults to be detected which affect both bus coupling devices, for example when both input voltages at the connecting devices drop, so that the difference between the two input voltages is sufficiently small, however the level of at least one of the two input voltages is no longer sufficient for the subscriber to function properly.

It is further advantageous when a condition necessary for switching the diagnostic signal from the second signal state to the first signal state is met by the level of the two input voltages and/or of the two input currents at the two connection inputs exceeding a predefined second threshold value. This measure also allows hysteresis to be achieved when switching between the first and the second signal state, when the first and second threshold values differ from each other.

In a preferred exemplary embodiment of the bus communication device, multiple connecting devices can be present. It is advantageous if the diagnostic devices of the connecting devices generate a shared diagnostic signal. The diagnostic signal indicates a fault when at least one of the diagnostic devices detects a fault. The diagnostic signal can preferably be transmitted to a shared display device and/or to a shared subscriber.

So as not to interfere with the communication with a subscriber, it is advantageous if the diagnostic device comprises an outcoupling circuit. In this way, alternating voltage components or alternating current components used for data transmission can be blocked. The diagnostic device can thus be supplied with electric power without impairing communication.

As an alternative or in addition, it is also possible for the diagnostic device to comprise a linear voltage regulator so as to stabilize the voltage for the power supply of the diagnostic device and enable a large input voltage range of 10 to 32 V, for example.

In an advantageous embodiment, the diagnostic device outputs the diagnostic signal at a diagnostic output which is galvanically isolated from the two connection inputs. The diagnostic output can thus also be used only passively, for example by a connected subscriber detecting the resistance of the diagnostic input and inferring the signal state therefrom. For this purpose, a diagnostic output resistor can be connected to the diagnostic output.

Advantageous embodiments of the invention will be apparent from the dependent claims, the description and the drawings. The description is limited to essential features of the invention. Preferred exemplary embodiments are described in more detail hereafter based on the accompanying drawings. In the drawings:

BRIEF DESCRIPTION OF THE DRAWINGS

FIG. 2a shows a block diagram of one exemplary embodiment of a decoupling circuit of the connecting device of FIG. 2;

FIG. 3 shows a block diagram of one exemplary embodiment of a connecting device having a diagnostic device.

DETAILED DESCRIPTION

Connections and connectors mentioned in the description refer to electrical connections and electrical connectors. For example, if it is stated that one element is connected to another element, it shall be understood that an electrical connection is meant. If mechanical couplings are to be described, this will be expressly mentioned; otherwise electrical connections and connectors are always involved.

Figure 1:
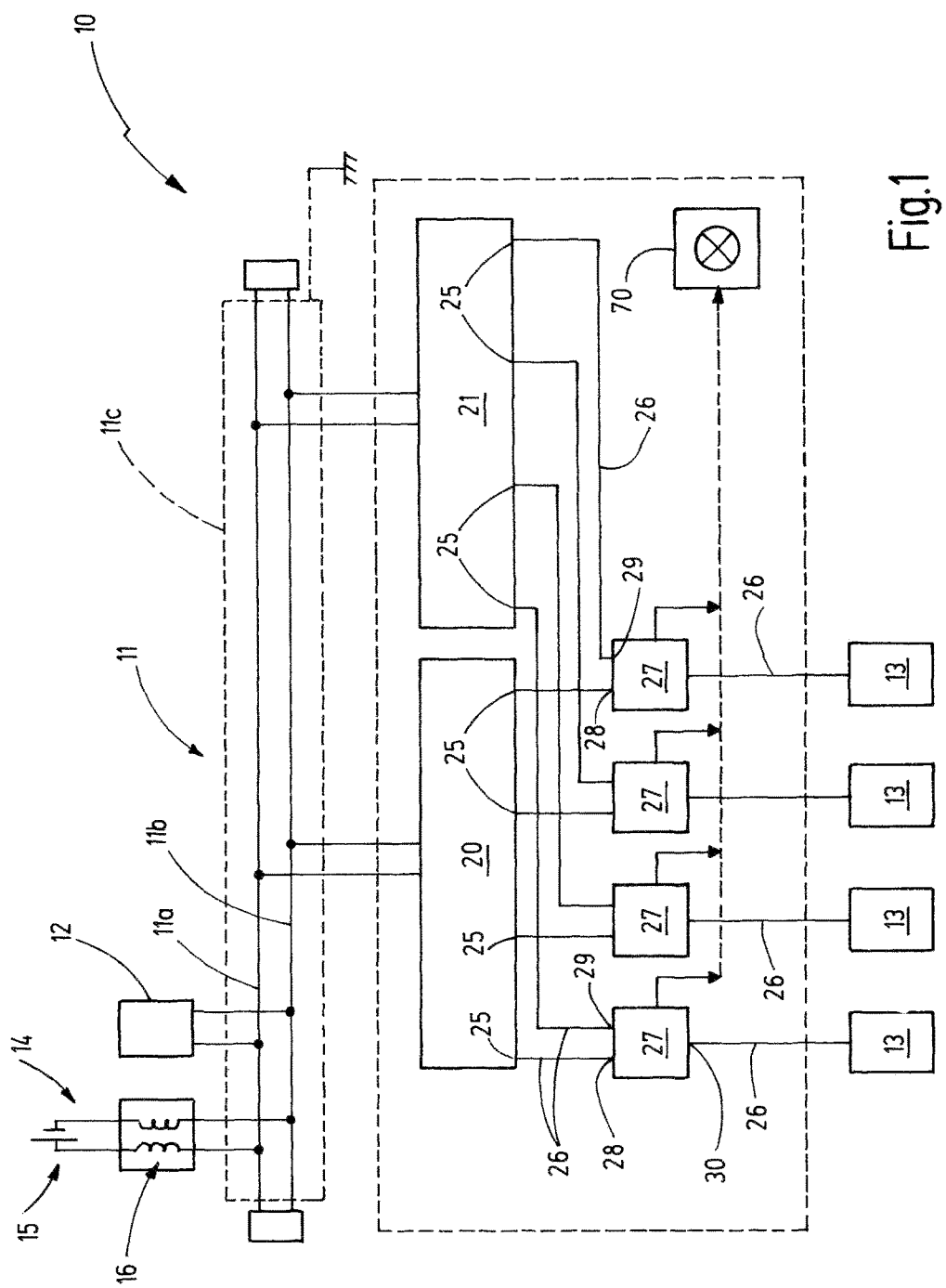
FIG. 1 shows a block diagram of one exemplary embodiment of a bus communication device.

FIG. 1 shows an exemplary embodiment of a bus communication device 10 as a block diagram. The bus communication device 10 comprises a bus line 11 having a first wire 11a and a second wire 11b, for example. A shield 11c of the bus line 11 is connected to ground.

A host computer 12 or another suitable communication control device is connected to the bus line 11. The host computer 12 is used to control the communication via the bus line 11 in accordance with a predefined communications protocol. As an alternative, it is also possible for the communication to be controlled by the subscribers 13 connected to the bus line 11, so that the host computer 12 performs only a limited control task. The host computer 12 can also be designed as a structural unit with a subscriber 13 in this case.

In addition, a suitable electric power source, for example a power supply unit 14, is connected to the bus line 11. The power supply unit 14 comprises a DC voltage source 15. The DC voltage source 15 supplies all connected electric or electronic assemblies with electric power, which can also be referred to as auxiliary power. The connection between the DC voltage source 15 and the wires 11a, 11b is created via an intermediate circuit 16. The intermediate circuit 16 can comprise means that prevent the modulations of the current or of the voltage to be influenced by the DC voltage source 15. Such modulations are necessary for communicating via the bus line 11. The intermediate circuit 16 can comprise inductors, for example, as is schematically illustrated in FIG. 1. In this way, a short circuit of communication signals by the DC voltage source 15 is avoided.

Figure 2:
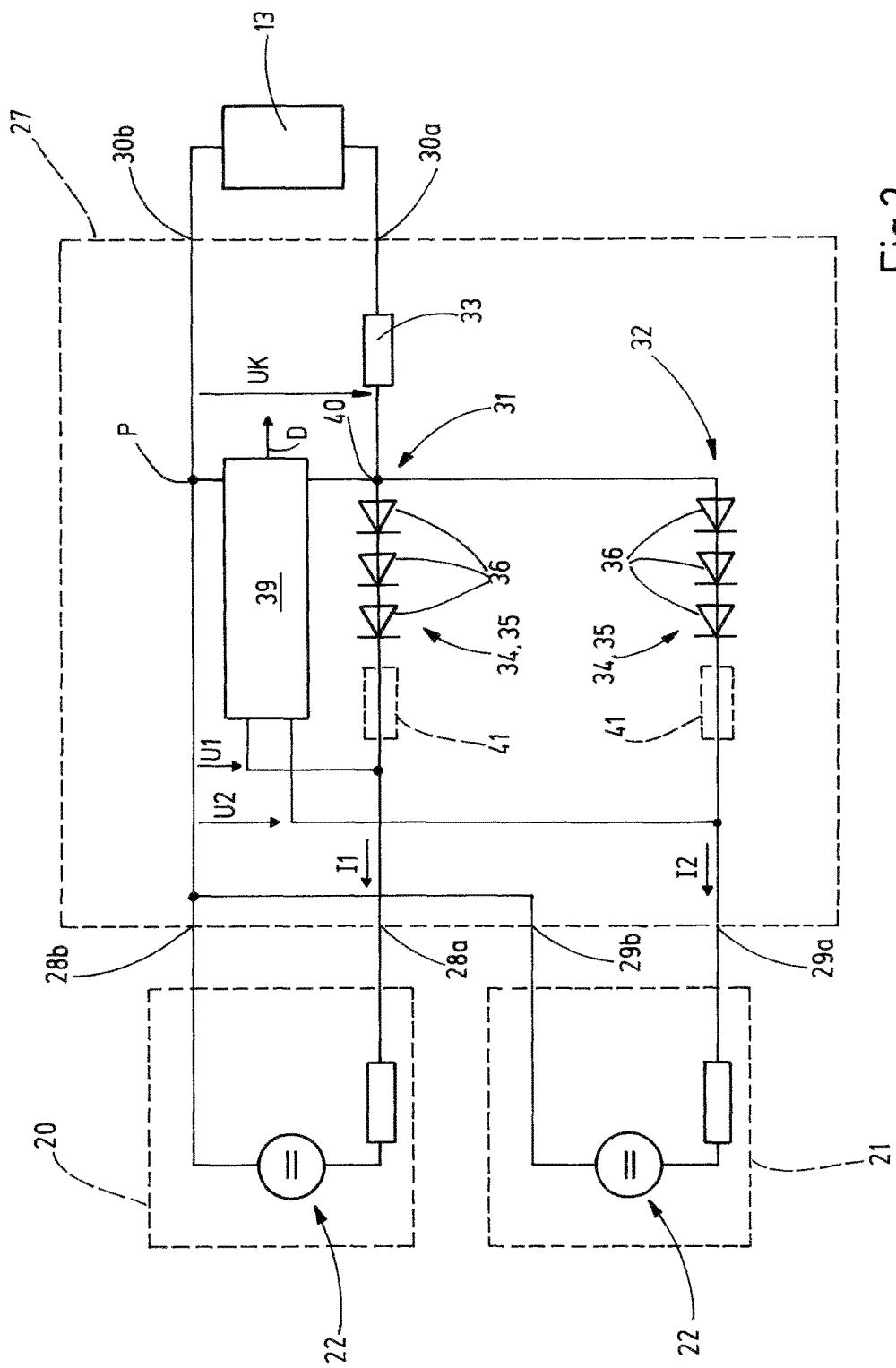
FIG. 2 shows a block diagram of a connecting device having a diagnostic device of the bus communication device according to FIG. 1.

The bus communication device 10 furthermore comprises a first bus coupling device 20 and a second bus coupling device 21. The two bus coupling devices 20, 21 are each connected to the bus line 11 and consequently to the two wires 11a, 11b. The subscribers 13 are coupled to the bus line 11 via the bus coupling devices 20, 21. Galvanic isolation can be provided by the bus coupling devices 20, 21. The bus coupling devices 20, 21 can optionally each comprise a DC-DC converter for galvanic isolation. The block diagram according to FIG. 2 schematically illustrates the subscriber-side connection side 22 of the bus coupling devices 20, 21 with or without DC-DC converter based on the graphical symbol of the DC voltage source.

It goes without saying that the number of bus coupling devices can also be greater than two. For explaining the operating principle, however, two bus coupling devices 20, 21 are sufficient, so that the description is limited to the first and second bus coupling devices 20, 21.

Each bus coupling device 20 has at least one coupling output, and they each have four coupling outputs 25 in the exemplary embodiment. One subscriber 13 can be connected to each coupling output 25. The connection between the bus coupling devices 20, 21 and the subscribers 13 is created via two-wire branch lines 26.

One or more of the subscribers 13 are redundantly connected both to the first bus coupling device 20, and to the second bus coupling device 21. In the exemplary embodiment shown in FIG. 1, this is the case with all subscribers 13 that are connected to the two bus coupling devices 20, 31. This redundancy ensures communication with a subscriber 13 even when one of the two bus coupling devices 20, 21 fails due to a defect. To achieve this, the at least one subscriber 13 to be redundantly coupled to the bus line 11 is connected to both bus coupling devices 20, 21 via a respective connecting device 27.

Each connecting device 27 has a first connection input 28 and a second connection input 29. The first connection input 28 is connected via a branch line 26 to one of the coupling outputs 25 of the first bus coupling device 20, while the second connection input 29 is connected via a branch line 26 to a coupling output 25 of the second bus coupling device 21. One connection output 30 of the connecting device 27 is connected via a branch line 26 to the associated subscriber 13.

The connecting device 27 is illustrated in a block diagram in FIG. 2. The first connection input 28 has a first input terminal 28a and a second input terminal 28b. The second connection input 29 has a first input terminal 29a and a second input terminal 29b. The second input terminal 28b of the first connection input 28 and the second input terminal 29b of the second connection input 29 are connected to each other and have the same electrical potential. A first input voltage U1 is present between the two input terminals 28a, 28b of the first connection input, and a second input voltage U2 is present between the input terminals 29a, 29b of the second connection input 29.

The second input terminals 28b, 29b of the two connection inputs 28, 29 are connected to a second output terminal 30b of the connection output 30 and have the same shared electrical potential P. The other, first output terminal 30a of the output 30 is connected via a first connecting branch 31 to the input terminal 28a of the first connection input 28 and via a second connecting branch 32 to the input terminal 29a of the second connection input 29. The two connecting branches 31, 32, for example, have a shared resistor assembly 33, which may also be eliminated in modified embodiments. The two connecting branches 31, 32 are designed without switches according to the example.

The resistor assembly 33 has at least one ohmic resistor and can also be composed of multiple ohmic resistors connected in parallel, so that the function is ensured even in the event of an interruption of one resistor.

Each connecting branch 31, 32 comprises a decoupling circuit 34. The decoupling circuit 34 can be designed as a diode circuit 35, for example, which in the simplest case consists of a single diode 36. The two connecting branches 31, 32 are connected to each other on a shared connecting node 40 on the resistor assembly 33, or at least on the connection output 30. The decoupling circuits 34 prevent current from flowing from a first input terminal 28a or 29a directly to the respective other first input terminal 29a or 28a.

In the exemplary embodiment according to FIG. 2, the anode side of the diode circuit 35 is assigned to the resistor assembly 33 and the cathode side is assigned to the respective first input terminal 28a or 29a, the electrical potential of which is smaller than that of the second input terminals 28b, 29b. In a modified exemplary embodiment, the orientation of the diode circuit 35 can be opposite if the first input terminals 28a, 29a have a higher electrical potential than the second input terminals 28b, 29b. It is ensured in both embodiments that a first input current I1 flows through the first connecting branch 31 only from the connection input 28 to the connection output 30, and that accordingly a second input current I2 flows through the second connecting branch 32 only from the second connection input 29 to the connection output 30. The diode circuits 35 or the decoupling circuits 34 in the connecting branches 31, 32 prevent a reverse current from flowing back from the one bus coupling device 20, 21 into the respective other bus coupling device 21 or 20.

In the exemplary embodiment of FIG. 2, each diode circuit 35 includes a series connection of at least two or three diodes 36. In this way, it is ensured that a reverse current from one bus coupling device 20, 21 into the respective other bus coupling device 21 or 20 is effectively prevented by the short circuit of one of the diodes 36. In a modification, the diode circuit 35 can also be composed of a parallel connection of in each case two or more diodes 36 that are connected in series, so that even interruptions in the electrical connection due to the fault of one diode 36 allow data transmission from the appropriate connection input 28, 29 to the connection output 30 (FIG. 2a). The diodes 35 can also be designed as Schottky diodes.

The connecting device 27 moreover comprises a diagnostic unit 39. According to the example, the diagnostic unit 39 is connected to the input terminal 28a of the first connection input and to the input terminal 29a of the second connection input, and to the input terminals 28b, 29b having the same potential. In this way, the first input voltage U1 and the second input voltage U2 can be detected by the diagnostic unit 39. Optionally, moreover the output terminal 30a of the connection output 30, the connecting node 40 or another location in the first connecting branch 31 or the second connecting branch 32 can be connected to the diagnostic unit 39. In this way, it is also possible to detect one or both input currents I1, I2, for example, in addition to the two input voltages U1, U2. The detection of the input currents I1, I2 is optional. In the exemplary embodiment, the connection of the diagnostic unit 39 to the two connecting branches 31, 32 can be used to detect the output voltage at the first output terminal 30a of the connection output 30 or a voltage that is characteristic thereof. In the exemplary embodiment, a node voltage UK between the connecting node 40 and the shared potential P is detected.

The diagnostic unit 39 generates a diagnostic signal D. The diagnostic signal D can be switched between a first signal state S1 and a second signal state S2. In the first signal state S1, the diagnostic signal D indicates the normal, fault-free operation of the two bus coupling devices 20, 21 to which the connecting device 27 is connected. For this purpose, the diagnostic unit 39 evaluates the two input voltages U1, U2, and optionally the input currents I1, I2. The second signal state S2 of the diagnostic signal D indicates that a fault is present at least in one of the two bus coupling devices 20, 21.

FIG. 3 illustrates a block diagram of one exemplary embodiment of the diagnostic unit 39. The diagnostic circuit 39 comprises an outcoupling circuit 46, which is connected to the higher potential of the two input voltages U1, U2. The electric power for the logic circuit part 39a of the diagnostic unit is provided via the outcoupling circuit 46. The outcoupling circuit is used to block higher frequencies and to provide only DC voltage components for supplying the diagnostic unit 39. The outcoupling circuit 46 acts more like an inductor or a low-pass filter.

The input voltages U1, U2 are evaluated in the logic circuit part 39a and, as a function thereof, the diagnostic signal D is provided on a diagnostic output 47. In the exemplary embodiment, the diagnostic output 47 is galvanically isolated from the remaining logic circuit part 39a by a galvanic isolation means 48. The galvanic isolation means 48 can include at least one optical relay for galvanic isolation, for example.

The diagnostic circuit 39 comprises a first diagnostic block 50. The two input voltages U1, U2, or input signals characterizing these input voltages U1, U2, are transmitted to the first diagnostic block 50. If necessary, the input voltages U1, U2 can be adapted to a necessary voltage level range by voltage dividers or the like, for example, before they are transmitted to the first diagnostic block 50. The first diagnostic block 50 evaluates the difference UD between the two input voltages and compares this difference UD to at least one predefined difference value and, according to the example, to two difference values UD1, UD2, which will be described in more detail hereafter based on FIG. 4. The first diagnostic block 50 generates a first output signal A1, which indicates whether the difference UD between the two input voltages U1, U2 is impermissibly high.

The node voltage UK is supplied to a second diagnostic block 51. The node voltage UK assumes a value that is based on the larger value, in absolute terms, of one of the two input voltages U1, U2. The node voltage UK is slightly lower, in absolute terms, than the larger one of the two input voltages U1, U2, in absolute terms, since a voltage drops in the connecting branches 31, 32 at the respective decoupling circuit 34 or the optionally present branch resistors 41.

Figure 4:
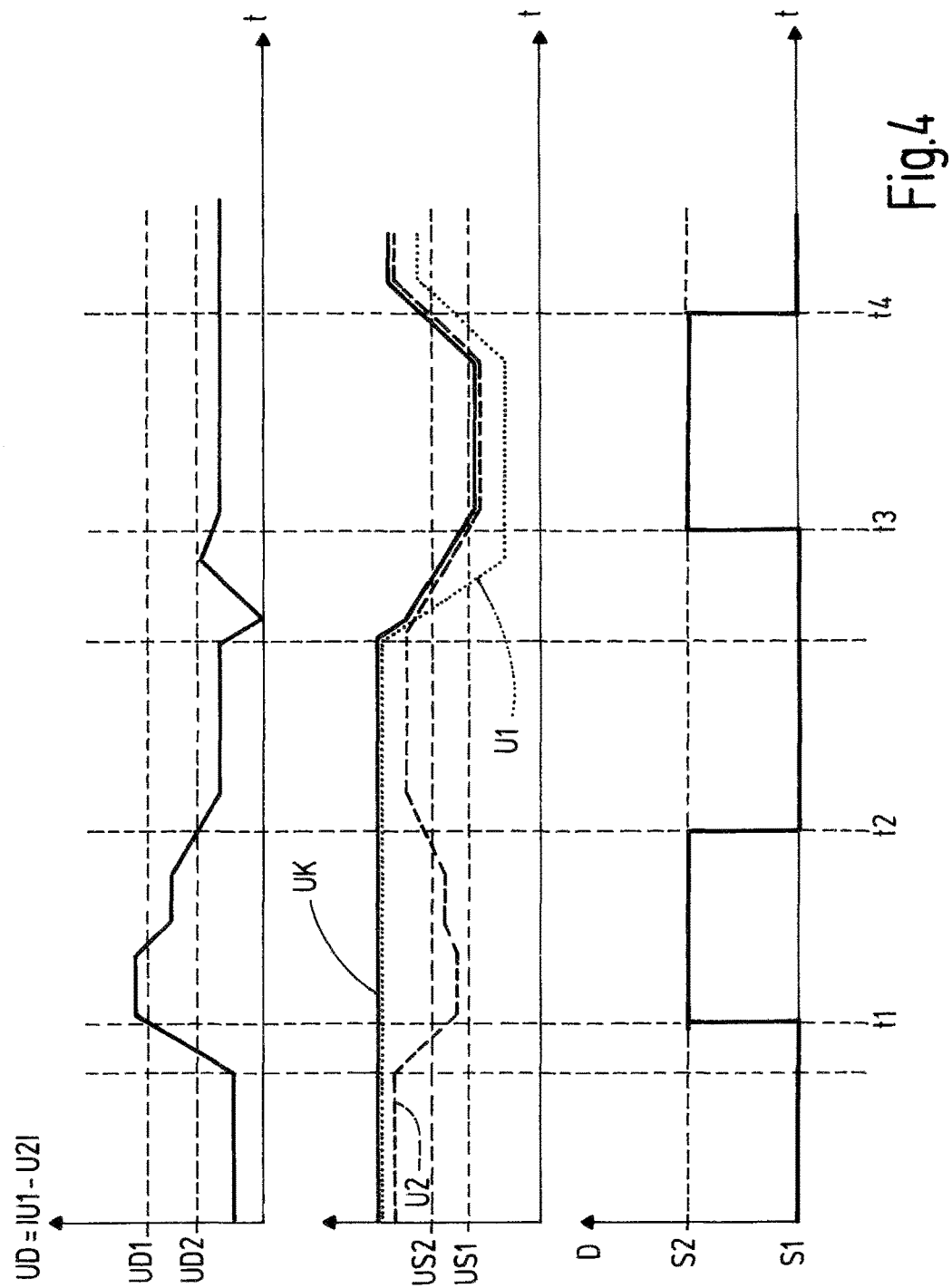
FIG. 4 is a schematic illustration of the input voltages at the connecting device and of the diagnostic signal of the diagnostic device as a function of the time.

The second diagnostic block 51 compares the node voltage UK to at least one threshold value, and according to the example to two threshold values US1, US2, as will be described hereafter based on FIG. 4. It goes without saying that it is also possible to transmit the two input voltages U1, U2 to the second diagnostic block 51, instead of the node voltage UK. The second diagnostic block 51 generates a second output signal A2. The second output signal A2 indicates whether or not the node voltage UK, and consequently the higher input voltage U1, U2, in absolute terms, has a sufficiently high potential.

The two output signals A1, A2 are transmitted to a third diagnostic block 52. There, the two output signals A1, A2 are linked to each other, and the diagnostic signal D is formed. As was already mentioned, the diagnostic signal D is subsequently conducted over a galvanic isolation means 48 and output.

The diagnostic signals D of multiple connecting devices 27, in turn, can be logically linked to each other and evaluated.

The operating principle of the connecting device 27 or the bus communication device 10 will be described hereafter based on FIG. 4. The illustration of FIG. 4 shows only exemplary schematic chronological progressions of the input voltages U1, U2 and of the signals derived therefrom to explain the operating principle. The node voltage UK is plotted in FIG. 4 over the progressions of the input voltages U1, U2 only for better schematic illustration. The node voltage UK is in fact slightly lower, in absolute terms, than the respective larger one of the two input voltages U1, U2, in absolute terms:

$$UK=\text{Max}(U1-\Delta U1, U2-\Delta U2),$$

where ΔU1, ΔU2 describe the particular voltage drop in the first or second connecting branch 31, 32, respectively. Only the operating principle will be described based on FIG. 4, wherein the exact chronological progression of the voltages is not important.

The subscribers 13 communicate with the host computer 12 and/or among each other via the bus line 11. Each subscriber 13 is connected both to the first bus coupling device 20, and to the second bus coupling device 21, via the connecting device 27. The electric power that is provided, or the electrical current that is provided, for a subscriber 13 is thus divided among the two bus coupling devices 20, 21 via the two connecting branches 31, 32. The load on the DC-DC converters (represented by the DC voltage source on the secondary side 22) of the bus coupling devices 20, 21 is thus reduced, and preferably they are loaded symmetrically. So as to equalize potentially present differences in the electric powers or the electrical currents that are provided via the two connecting branches 31, 32 at the connection output 30, or so as to reduce the currents through the connecting branches, optionally a respective branch resistor 41 can be connected in series with the respective decoupling circuit 34 in the connecting branches 31, 32.

The diagnostic unit 39 detects the first input voltage U1, the second input voltage U2, and according to the example also the node voltage UK. According to the example, the diagnostic unit 39 evaluates the difference UD between the two input voltages U1, U2. If the difference UD exceeds a predefined first difference value UD1, the diagnostic signal D is switched to the second signal state S2, in which it detects a fault of one of the two bus coupling devices 20, 21 (first point in time t1 in FIG. 4).

If the dropping or lost input voltage U1, U2 of one of the two bus coupling devices 20, 21 is a temporary fault, it is possible that the briefly dropped or lost input voltage U2, U2 becomes sufficiently high again after the diagnostic signal D has been switched to the second signal state. This means that the diagnostic unit 39 switches the diagnostic signal D back to the first signal state S1 if the difference UD between the two input voltages U1, U2 is again sufficiently small. According to the example, hysteresis is provided for. The diagnostic signal D is switched from the second signal state S2 to the first signal state S1 when the difference UD between the two input voltages U1, U2 drops below a second difference value UD2 (second point in time t2 in FIG. 4). The second difference value is smaller than the first difference value, in absolute terms. In this way, it is possible to prevent constant switching of the diagnostic signal D during voltage fluctuations by the first difference value UD.

In the exemplary embodiment described here, the diagnostic unit 39 also evaluates the level of at least one input voltage, and according to the example the levels of both input voltages U1, U2, in addition to the difference UD between the two input voltages U1, U2. In this way, it is also possible to detect faults in which both input voltages U1, U2 drop below a sufficient voltage value, for example when the voltage supply unit 14 does not provide sufficient supply voltage via the bus line 11 for the bus coupling devices 20, 21, so that a minimum voltage for the subscriber 13 is not ensured. The evaluation of the node voltage UK is used for this purpose.

If in the exemplary embodiment the level of the node voltage UK drops below a predefined first threshold value US1, the diagnostic signal D is switched to the second signal state and indicates a fault (third point in time t3 in FIG. 4). If the drop of the node voltage UK is temporary and the same increases again sufficiently, the diagnostic signal D is again switched from the second signal state S2 to the first signal state. According to the example, this takes place only after the node voltage UK is higher than a predefined second threshold value US2 (fourth point in time t4 in FIG. 4). The level of the second threshold value US2 is higher than the level of the first threshold value US1, so that again hysteresis is formed and excessively frequent or periodic switching of the diagnostic signal D as a result of dropping below or exceeding the first threshold value US1 is avoided.

In this way, in the exemplary embodiment the diagnostic signal D is switched to the second signal state S2 when either the difference UD between the two input voltages exceeds the first difference value UD1, or when both input voltages U1, U2 drop below, or the node voltage UK drops below, the first threshold value US1. The switching from the second signal state S2 back to the first signal state S1 only takes place when the difference UD between the input voltages U1, U2 exceeds, or has exceeded, the second difference value UD2, and when at least one of the two input voltages U1, U2 exceeds the second threshold value US2.

An optical and/or acoustic display unit 70 (FIG. 1) can be connected to the diagnostic output 47, in particular a luminous element. If no fault is present, the display unit 70 is supplied with electric power. As soon as a fault is detected, electric power is no longer supplied to the display unit 70. For example, a luminous element can extinguish and thereby indicate the fault. The power for the display unit 70 can be provided separately and/or outcoupled from the bus line 11.

It is furthermore possible to connect a subscriber 13, instead of the display unit 70, to the diagnostic output 47, the subscriber evaluating the diagnostic signal D. The subscriber 13 can transmit the proper or faulty function via the bus line 11, for example to the host computer 12. In this way, a detected fault of one of the bus coupling devices 20, 21 can be transmitted via the bus line 11 to any arbitrary remote, connected units.

The invention relates to a connecting device, to a method for the operation thereof, and to a bus communication device. The connecting device 27 has a first connection input 28, a second connection input 29, and a connection output 30. The two connection inputs 28, 29 are configured for the connection to a bus coupling device 20, 21. The connection output is configured for the connection to a subscriber 13. The first connection input 28 is connected to the connection output 30 via a first connecting branch 31, preferably without switches. The second connection input 29 is connected to the connection output 30 via a second connecting branch 32, preferably without switches. A decoupling circuit 34, having in particular at least two diodes 35, is disposed in each connecting branch 31, 32. The connecting device 27 includes a diagnostic unit 39, which generates a diagnostic signal D. The diagnostic signal D depends on the first input voltage U1 and/or on the first input current I1 at the first connection input 28 and/or on the second input voltage U2 and/or on the second input current I2 at the second connection input 29. Faults of the input voltages U1, U2, or of the input currents I1, I2, can be detected and indicated by the diagnostic signal D.

LIST OF REFERENCE NUMERALS 10 bus communication device
11 bus line
11a first wire
11b second wire
11c shield
12 host computer
13 subscriber
14 power supply unit
15 DC voltage source
16 intermediate circuit
20 first bus coupling device
21 second bus coupling device
22 user-side connection side 22
25 coupling output
26 branch lines
27 connecting device
28 first connection input
28a first input terminal of the first connection input
28b second input terminal of the first connection input
29 second connection input
29a first input terminal of the second connection input
29b second input terminal of the second connection input
30 connection output
30a first output terminal of the connection output
30b second output terminal of the connection output
31 first connecting branch
32 second connecting branch
33 resistor assembly
34 decoupling circuit
35 diode circuit
36 diode
39 diagnostic unit
39a logic circuit part
40 measuring point
41 branch resistor
46 outcoupling circuit
47 diagnostic output
48 galvanic isolation means
50 first diagnostic block
51 second diagnostic block
52 third diagnostic block
70 display unit
A1 first output signal
A2 second output signal
D diagnostic signal
S1 first signal state
S2 second signal state
U1 first input voltage
U2 second input voltage
UD difference
UD1 first difference value
UD2 second difference value
UK node voltage
US threshold value
US1 first threshold value
US2 second threshold value

What is claimed is:

1. A bus communication device (10), comprising:
a bus line (11), to which a first bus coupling device (20) and a second bus coupling device (21) are in each case electrically connected, each bus coupling device (20, 21) having at least one coupling output (25),
a connecting device (27) comprising a first connection input (28), a second connection input (29) and a connection output (30), the first connection input (28) being electrically connected to the connection output (30) via a first connecting branch (31), and the second connection input (29) being electrically connected to the connection output (30) via a second connecting branch (31), each of the connecting branches (30, 31) comprising a decoupling circuit (34), which prevents current from flowing from one of the connection inputs (28, 29) to the respective other connection input (29 or 28), and
a subscriber (13), which is electrically connected to the connection output (30),
wherein the first connection input (28) is electrically connected to the coupling output (25) of the first bus coupling device (20), and wherein the second connection input (29) is electrically connected to the coupling output (25) of the second bus coupling device (21).

2. The bus communication device according to claim 1, wherein the connecting device (27) comprises a diagnostic unit (39), which is electrically connected to the two connection inputs (28, 29) and is configured to generate a diagnostic signal (D), which depends on input voltages (U1, U2) and/or input currents (I1, I2) at the two connection inputs (28, 29).

3. The bus communication device according to claim 1, wherein the bus coupling devices (20, 21) and/or the connecting device (27) and/or the subscribers (13) have explosion-protected designs.

4. A bus communication device according to claim 2, wherein the diagnostic signal (D) is transmitted to an optical and/or acoustic display unit (70) and/or a subscriber (13).

5. A bus communication device according to claim 2, wherein the diagnostic unit (39) and/or the display unit (70) are configured to be supplied with electric power via the bus line (11) and via at least one of the bus coupling devices (20, 21).

6. A bus communication device according to claim 1, wherein the connecting device (27) comprises a current limiting means (33).

7. A bus communication device according to claim 1, wherein the decoupling circuit (34) has a series connection and/or a parallel connection with at least two diodes (35).

8. A bus communication device according to claim 1, wherein each of the connecting branches (30, 31) comprises a branch resistor (41).

9. A bus communication device according to claim 2, wherein the diagnostic signal (D) of the diagnostic unit (39) describes a normal operating state of the two bus coupling devices (20, 21) in a first signal state (S1) and an error state of at least one bus coupling devices (20, 21) in a second signal state (S2).

10. The bus communication device according to claim 9, wherein a difference (UD) between the two input voltages (U1, U2) and/or between the two input currents (I1, I2) at the two connection inputs (28, 29) exceeding a predefined first difference value (UD1) is a condition sufficient for switching the diagnostic signal (D) from the first signal state (S1) to the second signal state (S2).

11. The bus communication device according to claim 9, wherein the difference (UD) between the two input voltages (U1, U2) and/or input currents (I1, I2) at the two connection inputs (28, 29) dropping below a second difference value (UD2) is a condition necessary for switching the diagnostic signal (D) from the second signal state (S2) to the first signal state (S1).

12. A bus communication device according to claim 9, wherein a voltage value of the two input voltages (U1, U2) and/or a current value of the two input currents (I1, I2) at the two connection inputs (28, 29) dropping below a first threshold value (US1) is a condition sufficient for switching the diagnostic signal (D) from the first signal state (S1) to the second signal state (S2).

13. A bus communication device according to claim 9, wherein a voltage value of at least one of the two input voltages (U1, U2) and/or a current value of one of the two input currents (I1, I2) at the two connection inputs (28, 29) being greater than a predefined second threshold value (US2) is a condition necessary for switching the diagnostic signal (D) from the second signal state (S2) to the first signal state (S1).

14. A bus communication device according to claim 2, further comprising multiple connecting devices (27), and the diagnostic units (39) of the connecting devices (27) are configured to transmit a shared diagnostic signal (D) to a shared display unit (70) and/or to a shared subscriber (13).

15. A bus communication device according to claim 2, wherein the diagnostic unit (39) is electrically connected to the two connection inputs (28, 29) via an outcoupling circuit (46) and/or a linear voltage regulator.

16. A bus communication device according to claim 2, wherein the diagnostic unit (39) has a diagnostic output (47), which is galvanically isolated from the two connection inputs (28, 29).

17. A method for operating a bus communication device comprising:
- a bus line (11), to which a first bus coupling device (20) and a second bus coupling device (21) are in each case electrically connected, each bus coupling device (20, 21) having at least one coupling output (25),
- a connecting device (27) comprising a first connection input (28), a second connection input (29) and a connection output (30), the first connection input (28) being electrically connected to the connection output (30) via a first connecting branch (31), and the second connection input (29) being electrically connected to the connection output (30) via a second connecting branch (31), each of the connecting branches (30, 31) comprising a decoupling circuit (34), which prevents current from flowing from one of the connection inputs (28, 29) to the respective other connection input (29 or 28), and
- a subscriber (13), which is electrically connected to the connection output (30),
wherein the first connection input (28) is electrically connected to the coupling output (25) of the first bus coupling device (20), and wherein the second connection input (29) is electrically connected to the coupling output (25) of the second bus coupling device (21);
wherein the method comprises:
- detecting an input voltage (U1, U2) at each of the two connection inputs (28, 29) in the no-fault normal operation of the two bus coupling devices (20, 21), and
- supplying electric power for the subscriber (30) connected to the connection output (30) simultaneously via both connecting branches (31, 32).

18. The method according to claim 17, further comprising a diagnostic unit (39), which is electrically connected to the two connection inputs (28, 29), generating a diagnostic signal (D), which depends on the input voltages (U1, U2) and/or input currents (I1, I2) at the two connection inputs (28, 29).

19. The method according to claim 18, wherein the diagnostic signal (D) of the diagnostic unit (39) describes a fault-free state of the input voltages (U1, U2) and/or of the input currents (I1, I2) in a first signal state (S1), and describes an error state of the input voltages (U1, U2) and/or of the input currents (I1, I2) in a second signal state (S2).

* * * * *